(12) United States Patent
Kim et al.

(10) Patent No.: US 8,026,197 B2
(45) Date of Patent: Sep. 27, 2011

(54) METHOD AND APPARATUS FOR MANUFACTURING SUPERCONDUCTING TAPE THROUGH INTEGRATED PROCESS

(75) Inventors: Ho Seop Kim, Gimhae (KR); Sang Soo Oh, Changwon (KR); Hong Soo Ha, Changwon (KR); Kyu Jung Song, Changwon (KR); Dong Woo Ha, Changwon (KR); Rock Kil Ko, Gimhae (KR)

(73) Assignee: Korea Electrotechnology Research Institute (KR)

( * ) Notice: Subject to any disclaimer, the term of this patent is extended or adjusted under 35 U.S.C. 154(b) by 1026 days.

(21) Appl. No.: 11/863,251

(22) Filed: Sep. 28, 2007

(65) Prior Publication Data
US 2008/0220976 A1   Sep. 11, 2008

(30) Foreign Application Priority Data
Mar. 9, 2007   (KR) .................. 10-2007-0023420

(51) Int. Cl.
*H01L 39/24* (2006.01)
*H01L 39/02* (2006.01)
*B32B 15/04* (2006.01)
*B05D 5/12* (2006.01)
*C09J 5/02* (2006.01)

(52) U.S. Cl. ........ 505/434; 505/470; 505/475; 505/500; 505/704; 505/730; 427/62; 427/126.3; 427/248.1; 427/251; 427/255.23; 118/718; 118/720; 118/723 VE; 118/725; 118/730

(58) Field of Classification Search .................. 505/434, 505/447, 470, 473–477, 730, 732, 740, 741; 427/58, 62, 248.1, 251, 402, 126.3, 255.23, 427/294, 532; 29/599; 118/716, 718, 720, 118/723 VE, 725, 730
See application file for complete search history.

(56) References Cited

U.S. PATENT DOCUMENTS

| | | | |
|---|---|---|---|
| 6,527,866 B1 * | 3/2003 | Matijasevic et al. | 118/719 |
| 2004/0266628 A1 * | 12/2004 | Lee et al. | 505/238 |
| 2005/0220986 A1 * | 10/2005 | Selvamanickam et al. | 427/62 |
| 2005/0269021 A1 * | 12/2005 | Park et al. | 156/247 |

FOREIGN PATENT DOCUMENTS

| | | | |
|---|---|---|---|
| JP | 2003331670 A | | 11/2003 |
| KR | 100139734 B1 | | 3/1998 |
| KR | 1020060019444 A | | 3/2006 |
| KR | 1020070087340 A | | 8/2007 |
| WO | 2004-012278 A3 | | 5/2004 |

* cited by examiner

*Primary Examiner* — Steven Bos
*Assistant Examiner* — Kallambella Vijayakumar
(74) *Attorney, Agent, or Firm* — Park & Associates IP Law, P.C.

(57) ABSTRACT

A method and apparatus for manufacturing superconducting tape through an integrated process, including the steps of: heat-treating a substrate wound on a drum in a reaction chamber; continuously depositing components, constituting a buffer layer, a superconducting layer, a contact resistance layer, and a protective layer of the superconducting tape, which are supplied from a deposition chamber, on the substrate; and heat-treating the substrate deposited with the components. The present invention is advantageous in that the unit cost and time for manufacturing a superconducting tape are decreased because all processes for manufacturing a superconducting tape can be performed under the same conditions, the uniformity and performance of a superconducting tape is improved because the same deposition conditions are applied to all of the process for manufacturing a superconducting tape, and a high-quality superconducting tape having high deposition efficiency can be obtained because specific components can be deposited on a large-sized substrate using a drum.

8 Claims, 1 Drawing Sheet

US 8,026,197 B2

METHOD AND APPARATUS FOR MANUFACTURING SUPERCONDUCTING TAPE THROUGH INTEGRATED PROCESS

FIELD OF THE INVENTION

The present invention relates to a method and apparatus for manufacturing a superconducting tape, and, more particularly, to a method and apparatus for manufacturing a superconducting tape through an integrated process, which can obtain a high-quality superconducting tape using a simplified manufacturing apparatus and method because all superconductor manufacturing processes are performed under the same manufacturing conditions, and which can save time and economic costs.

BACKGROUND OF THE INVENTION

Generally, a superconducting tape is basically formed by depositing a buffer layer and a superconducting layer on a metal substrate and then depositing a contact resistance reducing layer and a protective layer thereon. This superconducting tape is manufactured by performing a process of previously heat-treating a metal substrate, a process of depositing a buffer layer, a process of depositing a superconducting layer, an oxygen heat-treatment process, a process of depositing a protective layer, and a lamination process.

As a conventional technology for such an apparatus for depositing a superconducting tape, International Application Publication No. WO 2004/012278 A2 discloses "an apparatus for depositing a superconducting material on a tape substrate". In the apparatus of the conventional technology, vacuum chambers as many the number of the above processes are serially disposed and communicate with each other, and a reel chamber including a supply reel for supplying a tape substrate and another reel chamber including a winding reel for winding a superconducting tape, deposited with a superconducting material, are connected to both ends of the series of vacuum chamber, respectively. As the tape substrate passes through the chambers each corresponding to each of the processes, it is sequentially deposited and heat-treated.

However, a process of manufacturing a superconducting tape using the apparatus has problems in that chamber fabricating costs are increased because chambers as many as the number of the processes are required, the yield of a superconducting tape can be decreased because the winding speed in the chamber having the lowest deposition rate and processing rate must be decreased due to the large number of chambers, and a superconducting tape having desired performance cannot be obtained when process variables depart from an optimum range in even one chamber.

Further, there is a problem in that the temperatures and gas atmospheres, which are the deposition conditions, are different from each other in different chambers, so that a separation chamber for separating the temperatures and atmospheres of the chambers must be additionally included, thereby increasing the unit cost of manufacturing a superconducting tape.

SUMMARY OF THE INVENTION

Accordingly, the present invention has been made to overcome the above problems occurring in the prior art, and an object of the present invention is to provide a method and apparatus for manufacturing a superconducting tape through an integrated process, including a deposition chamber for supplying specific components constituting a superconducting tape; a reaction chamber for depositing the specific components on a substrate, wound on a drum, and heat-treating the substrate; and a separation chamber for separating atmospheres of the deposition chamber and the reaction chamber, wherein all processes for manufacturing a superconducting tape are performed under the same conditions.

In order to accomplish the above object, an aspect of the present invention provides a method of manufacturing a superconducting tape, including the steps of heat-treating a substrate wound on a drum provided in a single reaction chamber; subsequently depositing a buffer layer, a superconducting layer, a contact resistance layer, and a protective layer on the substrate, the layer materials of which are supplied through a single deposition chamber; and heat-treating the substrate deposited with the layers.

Here, it is preferred that the method include the steps of depositing a component, constituting the buffer layer of the superconducting tape, supplied from the deposition chamber, on the substrate partially exposed to the deposition chamber while rotating a drum on which the substrate is wound; depositing a component, constituting the superconducting layer of the superconducting tape, supplied from the deposition chamber, after the step of depositing a buffer layer; heat-treating the superconducting tape including the buffer layer and the superconducting layer deposited thereon by supplying oxygen into the reaction chamber, after the step of depositing a superconducting layer; depositing a component, constituting the contact resistance reducing layer of the superconducting tape, supplied from the deposition chamber, on the superconducting layer by pumping gas into a separation chamber from the reaction chamber during the step of heat-treating the superconducting tape using oxygen; and depositing a component, constituting the protective layer of the superconducting tape, supplied from the deposition chamber, after the step of depositing a contact resistance reducing layer.

Here, it is preferred that the method further include a decarbonization heat treatment step of heat-treating the substrate wound on the drum in a reaction chamber while increasing a temperature of the substrate from a room temperature to a process temperature; and a reduction heat treatment step of reducing an oxide layer formed on the substrate in the reaction chamber after the decarbonization heat treatment step.

Further, in order to accomplish the above object, another aspect of the present invention provides an apparatus for manufacturing a superconducting tape through an integrated process, including a deposition chamber including a material supply unit for supplying specific components constituting a superconducting tape; and a reaction chamber configured to partially communicate with the deposition chamber and thus expose a substrate, wound on a drum, to the deposition chamber, wherein the specific components supplied from the deposition chamber are deposited on the substrate wound on the drum, so that a heat treatment process and a thin film deposition process for forming a superconducting tape are simultaneously performed under the same conditions.

Here, it is preferred that the apparatus include the deposition chamber provided therein with a plurality of material supply units to deposit the specific components constituting a thin film, on the substrate; the reaction chamber which partially communicates with the deposition chamber and in which the substrate is disposed to be exposed through a region at which the reaction chamber communicates with the deposition chamber, thus allowing the specific components supplied from the plurality of material supply units to be deposited on the substrate, the reaction chamber including a rotating drum on which the substrate is wound, a heater for heat-treating the substrate, and an oxygen supply unit for supplying oxygen into the reaction chamber; and a separation chamber formed between the deposition chamber and the reaction chamber to separate atmospheres of the deposition chamber and the reaction chamber from each other.

Further, it is preferred that the material supply unit be a vapor crucible, and that the separation chamber be configured to pump gas from the reaction chamber.

Accordingly, there are advantages in that the unit cost and time for manufacturing a superconducting tape are decreased because all processes for manufacturing a superconducting tape can be performed under the same conditions, the uniformity and performance of a superconducting tape is improved because the same deposition conditions are applied to all of the process for manufacturing the superconducting tape, and a high-quality superconducting tape having high deposition efficiency can be obtained because specific components can be deposited on a large-sized substrate using a drum.

BRIEF DESCRIPTION OF THE DRAWINGS

The above and other objects, features and advantages of the present invention will be more clearly understood from the following detailed description, taken in conjunction with the accompanying drawings, in which.

DETAILED DESCRIPTION OF THE INVENTION

Figure 1:
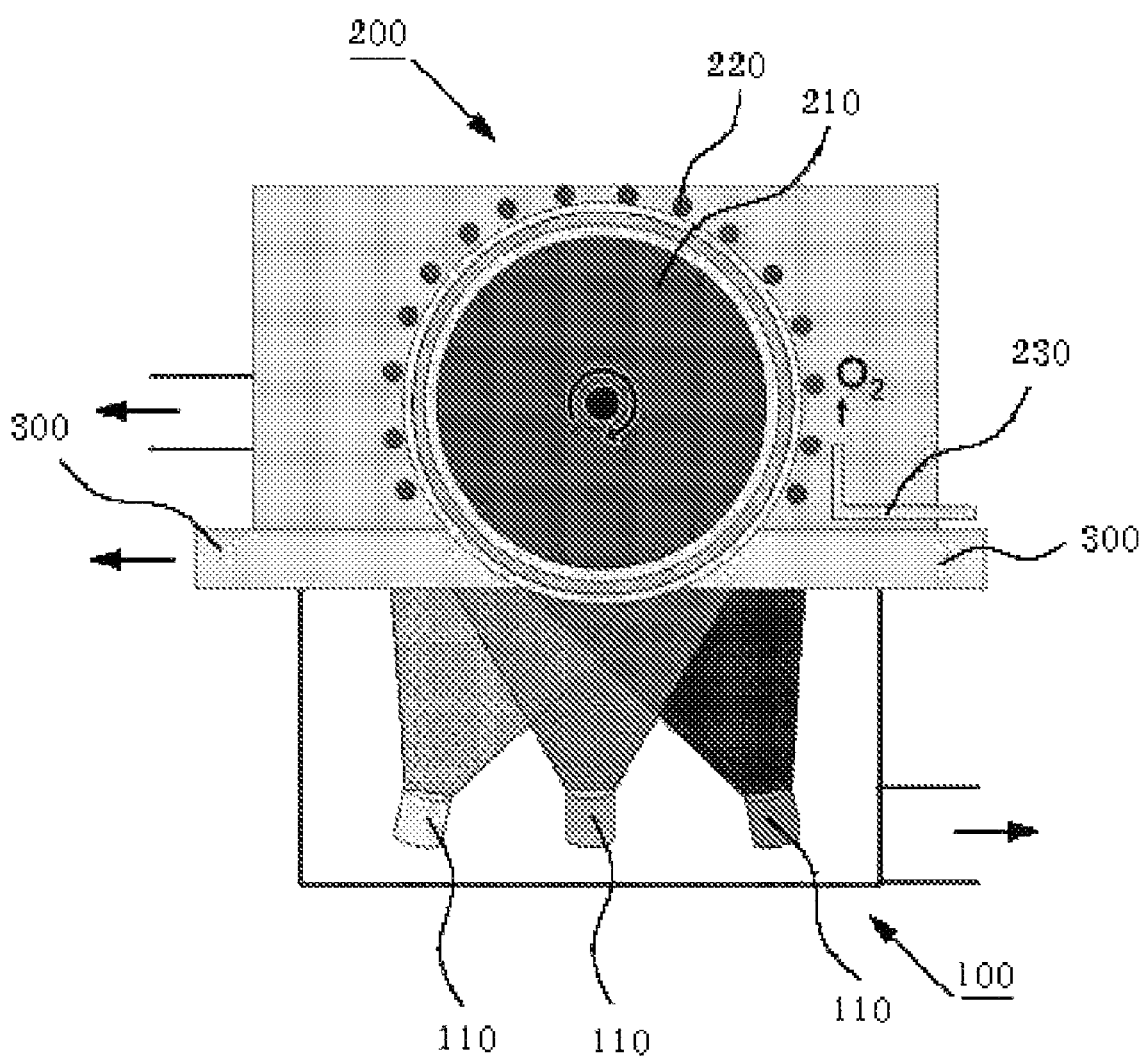
FIG. 1 is a schematic view showing an apparatus for depositing a superconducting tape through an integrated process according to the present invention.

Hereinafter, a preferred embodiment of the present invention will be described in detail with reference to the attached drawing.

FIG. 1 is a schematic view showing an apparatus for depositing a superconducting tape through an integrated process according to the present invention.

As shown in FIG. 1, the apparatus for depositing a superconducting tape through an integrated process according to the present invention basically includes a deposition chamber 100, a reaction chamber 200, and a separation chamber 300 for separating the deposition chamber 100 and the reaction chamber 200, which have different deposition conditions such as temperature and degree of vacuum.

The deposition chamber 100 is constantly maintained at a degree of vacuum of about $10^{-5}$ Torr so as to have a uniform composition ratio, and includes a plurality of material supply units 110 for supplying specific components, constituting a superconducting tape, on a substrate.

The material supply unit may be one or more selected from among a target unit using a sputtering deposition method, a target unit using a pulse laser deposition method, and a vapor crucible using a vapor deposition method. Preferably, the material supply unit is a vapor crucible using a vapor deposition method, in which processes of depositing specific components on a large-sized substrate are relatively easily performed.

Here, the vapor crucible is externally provided with an induction heating coil in order to heat the vapor crucible. In the induction heating coil, an inlet of the vapor crucible is placed at the center of the induction heating coil so as to heat the inlet of the vapor crucible to a higher temperature (because a magnetic field is the strongest at the center of the induction heating coil, so that the vapor crucible is easily heated through induction). The reason for this is that the inlet of the vapor crucible must be heated to a higher temperature because the inlet of the vapor crucible can become clogged due to the condensation of the vapor of deposition materials.

Accordingly, specific components constituting a superconducting tape are sublimed to a vapor phase, and the vaporized components reach a substrate and are then deposited on the substrate. Here, if necessary, in order to set deposition regions close to the material supply units 110, depending on an operational sequence of the material supply units 110, guide plates may be provided between the material supply units, or guide tubes may be provided in front of respective material supply units.

Subsequently, the reaction chamber 200 partially communicates with the deposition chamber 100, and serves to deposit materials, supplied from the material supply units 110 in the deposition chamber 100, on a substrate. In the present invention, the substrate is supplied in the form of tape wound around the outer surface of a drum 210. Here, the drum 210 and the substrate wound around it are exposed to the opening of the deposition chamber 100 through which the reaction chamber 200 communicates with the deposition chamber 100, and thus specific components constituting a superconducting tape are deposited on the substrate. Here, as the drum 210 rotates, specific components are deposited on the substrate, which is exposed to the deposition chamber 100 while the materials deposited on the substrate are heat-treated with oxygen at a predetermined pressure of 5 mTorr or lower in the inside of the reaction chamber 200 into which oxygen gas is supplied.

The specific components are supplied from the material supply units 110, and then sequentially deposited on the substrate. Generally, the specific components include components constituting a buffer layer deposited right on the substrate, components constituting a superconducting layer, components constituting a contact resistance reducing layer, and components constituting a protective layer. These components are supplied and deposited on the substrate depending in the order of deposition. These deposition components are sequentially supplied to the substrate, and, if necessary, oxygen gas is additionally supplied thereto, thereby performing deposition together with oxygen heat treatment. Further, where the deposition is performed under the conditions that the process temperatures for depositing the layers are controlled to be within the temperature range (700~800° C.) for depositing the superconducting layer, the deposition process can be continuously and integrally performed under the same deposition conditions.

Further, a heater 220 is disposed in the reaction chamber 200 adjacent to the drum 210 in order to heat-treat the substrate or materials deposited thereon. Generally, halogen heater is used as the heater 220, and the heater 220 can be controlled to heat the substrate or materials deposited thereon from a room temperature to a process temperature or more. That is, the heater serves to remove organic materials and an oxide layer from the substrate, and to prevent an oxygen deficiency phenomenon by supplying oxygen to a superconducting layer deposited on the substrate.

Further, the reaction chamber 200 is provided therein with an oxygen supply unit 230 for constantly controlling the pressure of oxygen and supplying the oxygen into the reaction chamber 200. Since the oxygen supply unit serves to prevent the oxygen deficiency phenomenon in a superconducting layer after the superconducting layer is deposited on the substrate, it is possible to deposit the superconducting layer on the substrate in an oxygen atmosphere (5 mTorr or lower) while conducting heat treatment of the substrate. Here, after oxygen is supplied into the reaction chamber 200 through the oxygen supply unit 230, and thus the heat treatment and the deposition of a superconducting layer are completed, the reaction chamber 200 is maintained in a vacuum atmosphere again because the oxygen in the reaction chamber 200 is pumped into a separation chamber 300, which is described below.

Subsequently, the separation chamber 300 serves to separate the thermal and vacuum deposition conditions of the deposition chamber 100 and the reaction chamber 200 from each other. The separation chamber 300 is disposed at region between the deposition chamber 100 and the reaction chamber 200, other than a region through which the deposition chamber 100 and the reaction chamber 200 communicate with each other. Here, in fact, the deposition chamber 100, the reaction chamber 200 and the separation chamber 300 communicate with each other through gaps between the separation chamber 300 and the drum 210. However, since gas is always pumped in the separation chamber 300 in a state in which the reaction chamber 200 is maintained at a high pressure and the deposition chamber is maintained at a low pressure, the gas in the high pressure reaction chamber 200 is not introduced into the deposition chamber 100 through the separation chamber 300. For this reason, the deposition chamber 100 and the reaction chamber 200 are separated from each other somewhat in terms of temperature and vacuum state.

According to the apparatus for manufacturing a superconducting tape of the present invention, the heat treatment process is performed in the reaction chamber 200, specific components constituting a superconducting tape, which are continuously supplied from the material supply units 110 in the deposition chamber 100, are deposited on the substrate wound on the drum 210. Meanwhile, in the reaction chamber 200, the heat treatment of a superconducting layer can be performed in an oxygen atmosphere, concurrently with or subsequently to the deposition of specific components. Consequently, all the deposition processes for manufacturing a superconducting tape can be continuously and simultaneously performed under the same deposition conditions.

Hereinafter, a method of manufacturing a superconducting tape through an integrated process according to the present invention will be described in detail.

Generally, in the case of an IBAD substrate, in which a buffer layer is deposited on a metal substrate, the method of manufacturing a superconducting tape includes a buffer layer deposition process, a superconducting layer deposition process, an oxygen heat-treatment process, a contact resistance reducing layer deposition process, and a protective layer deposition process. Meanwhile, in the case of a RABiTS substrate, which is a metal substrate in which crystals are biaxially aligned, the method of manufacturing a superconducting tape further includes a heat-pretreatment process in addition to the above processes. The heat-pretreatment process includes a decarbonization heat-treatment process of removing organic materials from the interior of metal and a reduction heat-treatment process of removing an oxide layer from a surface of metal. Hereinafter, a method of manufacturing a superconducting tape will be described below with reference to the case where a RABiTS substrate is used as the metal substrate.

1) Decarbonization Heat-Treatment Step

The decarbonization heat-treatment step is used to remove organic materials included in a substrate. In this step, the substrate is heat-treated from room temperature to a process temperature of 700~800° C. for 2 hours in a reaction chamber 200 while supplying a mixed gas of argon and oxygen. In this case, the partial pressure of the mixed gas may be in the range of several mTorr to 200 mTorr. As the temperature of the substrate is increased, organic materials included in the metal substrate are diffused to the surface of the substrate, and the diffused organic materials react with oxygen on the surface thereof, thereby producing CO and $CO_2$. These gases are discharged outside using a vacuum pump.

2) Reduction Heat-Treatment Step

The reduction heat-treatment step is performed in a reaction chamber 200 so as to remove an oxide layer formed on the surface of a substrate through a reduction reaction. Since the growth of an oxide layer dominantly progresses on a plane (111) and thus epitaxial growth on a plane (001) cannot be anticipated under normal process conditions, the oxide layer must be removed through reduction heat-treatment. This reduction heat-treatment is performed at a temperature of 700~800° C. In this case, when the temperature in the reduction heat-treatment is controlled to be equal to that in buffer layer deposition, which will be performed later, processes for increasing and decreasing the temperature need not be performed. A mixed gas including hydrogen is used as a gas supplied at the time of the reduction heat-treatment. The reduction heat-treatment is performed while maintaining the partial pressure of the mixed gas in the range of several mTorr to 200 mTorr.

3) Buffer Layer Deposition Step

The buffer layer deposition step is performed by rotating a drum 210, around which a substrate is wound, an opening region through which the deposition chamber 100 and the reaction chamber 200 communicate with each other. In the buffer layer deposition step, a buffer layer is formed on the substrate in order to prevent the mismatch of lattice between the substrate and the superconducting layer and the diffusion of the substrate. This buffer layer is comprised of a plurality of thin films, and, generally, is comprised of a multi-layered thin film such as $CeO_2/YSZ/CeO_2$, $CeO2/Y_2O_3/CeO_2$ or $Y_2O_3/CeO_2$. The deposition temperature for the buffer layer may be in the range of 500~800° C., and the deposition rate thereof is about several Å/sec. Further, in the buffer layer deposition step, water vapor in the reaction chamber 200 is used as an oxidation source, and an oxidation reaction can be induced by arbitrarily maintaining the partial pressure of gas using oxygen. In this case, when the temperature in the buffer layer deposition is controlled to be equal to that in superconducting layer deposition, which is described below, processes for increasing and decreasing the temperature need not be performed.

4) Superconducting Layer Deposition Step

Directly after the buffer layer deposition is performed, a superconducting layer is deposited on the buffer layer. The process temperature for depositing the superconducting layer is in the range of 700~800° C., and the partial pressure of oxygen is 5 mTorr.

5) Oxygen Heat-Treatment Step

Directly after the superconducting layer deposition is performed, this oxygen heat treatment is performed. In this step, the process temperature for performing oxygen heat-treatment is controlled by cutting off a power source and conducting natural cooling, and oxygen, serving as a process gas, is supplied into a reaction chamber until the pressure of the oxygen becomes atmospheric pressure. The reason for performing oxygen heat-treatment is that the composition ratio of oxygen is adjusted to be suitable for a superconducting layer having insufficient oxygen.

6) Contact Resistance Reducing Layer Deposition Step

This step is performed to reduce contact resistance by depositing a contact resistance reducing layer composed of Au or Pt between the superconducting layer and a protective layer, which is described below. This deposition is performed after the reaction chamber forms a vacuum during the oxygen heat-treatment process. Directly after the deposition is performed, oxygen heat-treatment is performed again.

7) Protective Layer Deposition Step

A protective layer serves to protect the superconducting layer from physical and chemical damage, and to protect a superconductive sheet by forming an alternate route for current when the superconductive sheet is quenched. The protective layer is formed on the contact resistance reducing layer. The protective layer is made of cheap material having high conductivity, such as copper or the like.

According to the method of manufacturing a superconducting tape of the present invention, the heat treatment process is performed in the reaction chamber 200, specific components constituting a superconducting tape, which are continuously supplied from the material supply units 110 in the deposition chamber 100, are deposited on the substrate wound on the drum 210, and, in the reaction chamber 200, the heat treatment of a superconducting layer can be performed in an oxygen atmosphere, concurrently with or subsequently to the deposition of specific components, so that all deposition processes for manufacturing a superconducting tape can be continuously and integrally performed under the same deposition conditions.

The present invention is advantageous in that the unit cost and time for manufacturing a superconducting tape are decreased because all processes for manufacturing a superconducting tape can be performed under the same conditions, the uniformity and performance of a superconducting tape is improved because the same deposition conditions are applied to all of the process for manufacturing a superconducting tape, and a high-quality superconducting tape having high deposition efficiency can be obtained because specific components can be deposited on a large-sized substrate using a drum.

As described above, although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a superconducting tape comprising the steps of:
   heat-treating a substrate wound on a drum provided in a single reaction chamber;
   depositing a buffer layer, a superconducting layer, a contact resistance layer, and a protective layer on the substrate, with constituent materials of each layer supplied through a single deposition chamber onto a portion of the substrate exposed between the reaction chamber and the deposition chamber; and
   heat-treating the layer-deposited substrate.

2. The method of manufacturing a superconducting tape according to claim 1,
   wherein said buffer layer depositing step is performed with the substrate partially exposed to the deposition chamber and while rotating a drum on which the substrate is wound, and
   wherein said depositing a component, constituting the superconducting layer is performed after depositing the buffer layer.

3. The method of manufacturing a superconducting tape according to claim 2, further comprising the following steps performed before depositing the buffer layer:
   a decarbonization heat treatment step of heat-treating the substrate wound on the drum in the reaction chamber while increasing a temperature of the substrate from a room temperature to a process temperature; and
   a reduction heat treatment step of reducing an oxide layer formed on the substrate in the reaction chamber after the decarbonization heat treatment step.

4. The method of manufacturing a superconducting tape according to claim 2, wherein said heat-treating the layer-deposited substrate is performed with oxygen supplied into the reaction chamber, which is performed after the step of depositing the superconducting layer.

5. The method of manufacturing a superconducting tape according to claim 4, wherein said depositing the contact resistance reducing layer is performed while pumping gas into a separation chamber from the reaction chamber in the step of heat-treating the superconducting tape using oxygen.

6. The method of manufacturing a superconducting tape according to claim 5, wherein said depositing the protective layer is performed after the step of depositing the contact resistance reducing layer.

7. A method of manufacturing a superconducting tape comprising the steps of:
   heat-treating a substrate wound on a drum provided in a single reaction chamber;
   sequentially depositing a buffer layer, a superconducting layer, a contact resistance layer, and a protective layer on the substrate, with constituent materials of each layer supplied through a single deposition chamber onto a portion of the substrate exposed between the reaction chamber and the deposition chamber; and
   heat-treating the layer-deposited substrate;
   wherein said heat-treating the layer-deposited substrate is performed with oxygen supplied into the reaction chamber;
   wherein said depositing the contact resistance reducing layer is performed while pumping gas into a separation chamber from the reaction chamber.

8. The method of manufacturing a superconducting tape according to claim 7, further comprising the following steps performed before depositing the buffer layer:
   a decarbonization heat treatment step of heat-treating the substrate wound on the drum in the reaction chamber while increasing a temperature of the substrate from a room temperature to a process temperature; and
   a reduction heat treatment step of reducing an oxide layer formed on the substrate in the reaction chamber after the decarbonization heat treatment step.

* * * * *